United States Patent
De Nunzio et al.

(10) Patent No.: US 12,190,720 B2
(45) Date of Patent: Jan. 7, 2025

(54) METHOD OF DETERMINING THE AMOUNT OF POLLUTANT EMISSIONS FROM A VEHICLE OVER A ROAD NETWORK SECTION

(71) Applicant: IFP Energies nouvelles, Rueil-Malmaison (FR)

(72) Inventors: Giovanni De Nunzio, Rueil-Malmaison (FR); Mohamed Laraki, Rueil-Malmaison (FR); Bassel Othman, Rueil-Malmaison (FR); Laurent Thibault, Rueil-Malmaison (FR)

(73) Assignee: IFP ENERGIES NOUVELLES, Rueil-Malmaison (FR)

( * ) Notice: Subject to any disclaimer, the term of this patent is extended or adjusted under 35 U.S.C. 154(b) by 329 days.

(21) Appl. No.: 17/692,677

(22) Filed: Mar. 11, 2022

(65) Prior Publication Data

US 2022/0335822 A1 Oct. 20, 2022

(30) Foreign Application Priority Data

Apr. 14, 2021 (FR) ..................................... 2103844

(51) Int. Cl.
| | | |
|---|---|---|
| *G08G 1/01* | (2006.01) | |
| *G06F 30/27* | (2020.01) | |
| *G08G 1/00* | (2006.01) | |
| *G08G 1/052* | (2006.01) | |

(52) U.S. Cl.
CPC ........... *G08G 1/0137* (2013.01); *G06F 30/27* (2020.01); *G08G 1/0125* (2013.01); *G08G 1/052* (2013.01); *G08G 1/20* (2013.01)

(58) Field of Classification Search
None
See application file for complete search history.

(56) References Cited

U.S. PATENT DOCUMENTS

| 2010/0060482 A1* | 3/2010 | Emam ............... G08G 1/096708 340/905 |
| 2017/0010618 A1* | 1/2017 | Shashua ............... B62D 15/025 |
| 2019/0102960 A1 | 4/2019 | Thibault et al. |
| 2019/0138669 A1 | 5/2019 | Thibault et al. |

(Continued)

FOREIGN PATENT DOCUMENTS

| CN | 101886940 A | 11/2010 |
| CN | 103838971 A | 6/2014 |
| CN | 102496079 B | 4/2015 |

(Continued)

OTHER PUBLICATIONS

Search Report for FR 2103844 dated Dec. 17, 2021; 2 pages.

(Continued)

*Primary Examiner* — Raul J Rios Russo
*Assistant Examiner* — Carl F. R. Tchatchouang
(74) *Attorney, Agent, or Firm* — Fitch, Even, Tabin & Flannery LLP (57) ABSTRACT

The present invention is a method for determining the amount of pollutant emissions (Q) from at least one vehicle over a road network section, wherein a pollutant emission model (MFE) is constructed by machine learning (APP) using macroscopic data (MAC) of a learning road network and traffic data (TRA). This model (MFE) is then applied to a road network section.

18 Claims, 2 Drawing Sheets

(56) References Cited

U.S. PATENT DOCUMENTS

2020/0355108 A1* 11/2020 Rodriguez Rodriguez ................. F01N 13/008
2021/0172750 A1* 6/2021 De Nunzio .......... G08G 1/0129

FOREIGN PATENT DOCUMENTS

| CN | 104715605 A | 6/2015 |
|---|---|---|
| CN | 105206056 A | 12/2015 |
| CN | 109191793 A | 1/2019 |
| CN | 110232816 A | 9/2019 |
| FR | 3049653 A1 | 10/2017 |
| FR | 3097822 A1 | 12/2020 |
| IN | 202041007032 | 2/2020 |

OTHER PUBLICATIONS

Written Opinion for FR 2103844 dated Apr. 14, 2021, 7 pages.
Rakha, H., et al. (2004). Development of VT-Micro Model for Estimating Hot Stabilized Light Duty Vehicle and Truck Emissions. Transportation Research Part D: Transport and Environment, 9(1), 49-74.
Qi, Y. G., Tet al. (2004). Microscale Emission Models Incorporating Acceleration and Deceleration. Journal of Transportation Engineering, 130(3), 348-359.
Hbefa, (Hausberger, S. (2009). Emission Factors from the Model PHEM for the HBEFA Version 3, Institute for Internal Combustion Engines and Thermodynamics; 76 pages.
Hausberger, S., et al. (2003). Emission Factors for Heavy-Duty Vehicles and Validation by Tunnel Measurements. Atmospheric Environment, 37(37), 5237-5245.). 9 pages.
Gartner, U., et al. (2004). Development and Application of a Semi-Epirical NOx Model to Various HD Diesel Engines. In Thermo-and Fluid Dynamic Processes in Diesel Engines 2 (pp. 285-312).
Scora, G., et al. (Jun. 2006). Comprehensive Modal Emission Model (CMEM), version 3.01 user's guide. University of California, Riverside, Center for Environmental Research and Technology, 153 pages.
Ntziachristos, L., et al. (2009). COPERT: A European Road Transport Emission Inventory Model. In Information Technologies in Environmental Engineering (pp. 491-504). Springer, Berlin, Heidelberg).

* cited by examiner

METHOD OF DETERMINING THE AMOUNT OF POLLUTANT EMISSIONS FROM A VEHICLE OVER A ROAD NETWORK SECTION

CROSS-REFERENCE TO RELATED APPLICATION

Reference is made to French Application No. 21/03.844 filed Apr. 14, 2021, designating the United States, which is incorporated herein by reference in its entirety.

BACKGROUND OF THE INVENTION

Field of the Invention

The present invention relates to the determination of pollutant emissions from at least one vehicle over a road network.

Description of the Prior Art

According to the World Health Organization (WHO), about 18,000 deaths per day can be attributed to poor air quality, which brings the estimate to about 6.5 million deaths per year. Air pollution also represents a major financial issue. According to a Senate committee of inquiry, the total estimated cost of air pollution ranges between 68 and 97 billion Euros per year in France, as assessed in July 2015, considering both the health damage caused by pollution and its consequences on buildings, ecosystems and agriculture.

The transport sector still represents a major source of emissions despite the many measures taken by the public authorities and the technological advances in the field. Transport, across all modes, is responsible for about 50% of global nitrogen oxides (NOx) emissions and about 10% of PM2.5 particulate emissions (i.e. particles with a diameter less than 2.5 microns). Road transport alone makes a significant contribution to transport-related emissions, with 58% of the NOx emissions and 73% of the PM2.5 particulate emissions. These emissions are mainly due to three factors which are exhaust emissions, abrasion emissions and evaporative emissions. Although heavy-duty trucks are the main pollutant emitters, passenger vehicles, which are more densely present in populated urban areas, have the highest impact on citizens' exposure to poor air quality.

Measures taken locally for transport management such as better transport planning and incentives for modal shift, are transport mode change, as well as progressive fleet renewal, which have contributed to limiting exhaust gas emissions from road transport in cities and urban areas. Indeed, worldwide, the road transport activity has increased by a quarter in the last decade, whereas NOx emissions have increased by 5% and particulate emissions have decreased by 6%. Despite such improvements, the pollution levels still exceed the thresholds set by WHO in many cities.

In order to significantly improve air quality, the French authorities in urban areas need to take action to reduce road transport-related emissions. By way of example, currently, this sector represents, in the greater Lyon area, respectively two thirds of the total nitrogen oxides (NOx) emissions and one third of the total PM10 particulate emissions. However, to date, the road maintenance and urban mobility services of this authority have no tools allowing them to determine the impact on the air quality of road equipments. The decisions made in connection with these subjects do not take into account of the impact on emissions because of the lack of tools.

More precisely, to date, the operational tools allowing city services and road managing authorities to estimate pollutant and greenhouse gas emissions on the various sections of a road network are the macroscopic models based on emission factors (a multiplicative coefficient depending on the average speed on the road section). It is generally known that, with equal average speeds, two different road sections (for example an urban road section with fluid traffic and a congested highway section) can have highly contrasted emission levels, which would be poorly represented by a single emission factor.

It is therefore difficult for cities to make the right decisions regarding road infrastructure development or in terms of legislation without the specific tools for assessing and predicting the impact of the measures on road transport emissions and air quality. These new tools should ideally allow evaluation of the impact of such measures at very fine time and spatial scales (of the order of a minute and of the order of ten meters).

The first approach for estimating emissions from the dynamics of a vehicle simply carries out emission tests on a dynamometric test bench. Pollutant measurements allow for example producing matrices giving an average pollutant emission rate associated with speed and acceleration values for the vehicle. However, the data resulting from such tests is not representative of real driving conditions insofar as it essentially characterizes steady-speed operating conditions of the vehicle engine.

To overcome this problem, portable emission measurement systems have been developed from the 1990s in order to associate the emissions with the vehicle dynamics under real conditions. From this data, more precise models known as microscopic models can be established to give the instantaneous emission rate of a vehicle according to the dynamics thereof. It may be, for example, neural networks or linear regression models such as, for example:

- the model known as «Virginia Tech Microscopic energy and emissions model (VT-Micro)», of Virginia Tech, which takes as the input data the vehicle speed and acceleration (as described in the document Rakha, H., Ahn, K., & Trani, A. (2004). Development of the VT-Micro model estimated hot stabilized light duty vehicle and truck emissions. Transportation Research Part D: Transport and Environment, 9 (1), 49-74.), the model known as "POLY" also considers the slope (as described in the document Qi, Y. G., Teng, H. H., & Yu, L. (2004). Microscale emission models incorporating acceleration and deceleration is discussed in Journal of Transportation Engineering, 130 (3), 348-359.), or
- the model known as "Passenger Car and Heavy Duty Emission Model (PHEM)", of the Graz University of Technology, which is based on the use of maps with corrective factors (as described in the document Hausberger, S., Rodler, J., Sturm, P., & Rexeis, M. (2003). Emission Factors for Heavy-Duty Vehicles and Validation by Tunnel Measurements. Atmospheric Environment, 37 (37), 5237-5245.).

To go further, some of these models, which are previously calibrated from experimental data, have also been validated under real driving conditions.

Portable emission measurement systems are suitable for characterization of some specific vehicles, but not for very large scale measurements, notably because of the cost associated with their use. An alternative solution could measure the traffic emissions indirectly using air quality sensors, but it is difficult to associate pollution with its source. Thus, when it comes to estimating the pollutant emissions of a vehicle for which this type of data is not available, one alternative calculates them using a physical microscopic model, which in addition takes as input data the characteristics of the vehicle in question (weight, engine power, etc.), as described in the document Gartner, U., Hohenberg, G., Daudel, H., & Oelschlegel, H. (2004). Development and Application of a Semi-Empirical NOx Model to Various HD Diesel Engines. In Thermo-and Fluid Dynamic Processes in Diesel Engines 2 (pp. 285-312). Springer, Berlin, Heidelberg, or in the widely used model known as "Comprehensive Modal Emission Model (CMEM)" of the University of California, which is a combination of parameterizable physical models (as described in the document Barth, M., An, F., Younglove, T., Scora, G., Levine, C., Ross, M., & Wenzel, T. (2000). Comprehensive Modal Emission Model (CMEM), version 2.0 user's guide. University of California, Riverside, 4.).

These microscopic models, whether based on data or on a physical model, however have computational time and memory consuming issues and they are therefore generally designed essentially for offline studies. In addition, they require precise dynamic speed profiles that are in practice only rarely measured. Thus, another category of models, referred to as macroscopic, has been developed to estimate large-scale emissions when the numerical complexity becomes too high, or when the individual vehicle trajectories are not available. Among the macroscopic emission models, the most prevalent approach introduces emission factors (FE) (as described in the documents Ntziachristos, L., Gkatzoflias, D., Kouridis, C., & Samaras, Z. (2009) and COPERT: a European Road Transport Emission Inventory Model and In Information Technologies in Environmental Engineering (pp. 491-504) and Yu, L., Xu, Y., Song, G., Hao, Y., Guo, S., & Shi, Q. (2009). Development and Application of Macroscopic Emission Model for China. Transportation Research Record, 2123 (1), 66-75. Springer, Berlin, Heidelberg.). Emission factors FE correspond to average emission values per vehicle and per distance travelled. In most cases, this approach is based on "average" vehicles with an "average" driving style so as to be representative of the emissions level when upscaling. The approaches known as COPERT (Computer Program to calculate Emissions from Road Transports), described in Ntziachristos, L., Gkatzoflias, D., Kouridis, C., & Samaras, Z. (2009). COPERT: a European Road Transport Emission Inventory Model. In Information Technologies in Environmental Engineering (pp. 491-504). Springer, Berlin, Heidelberg and HBEFA (Hausberger, S. (2009) and Emission Factors from the Model PHEM for the HBEFA Version 3 discuss widespread macroscopic models based on emission factors FE. This type of model is very suitable for vehicle emissions balances on a regional or national scale. It may also enable quite precise estimation of the emissions associated with long drives. However, the approach associated with emission factors FE is by definition is not precise enough when it comes to estimating the real emissions on a small scale, because it does not take into account of the impact of the local infrastructure and of the driving style. The main cause of errors is the impact of the driving style and of the slope.

Chinese patent applications CN109086246A, CN105243855A, CN102289656A describe an approach based on at least one of a use and a calibration of emission factors for different vehicles under different road conditions. This approach may therefore consumes computational time and random-access memory if measurements need to be performed for different driving conditions for several vehicle types. Furthermore, its extrapolation for a different road network having different infrastructures will be of limited precision. This is due to the fact that these emission factors generally depend only on the slope, the vehicle type and the average speed.

Chinese patent applications CN102496079 A, CN101886940 A, CN103838971A, CN104715605 A describe a calibration of a microscopic emission model. For this approach, several measurements are required to recalibrate such a model. This model is more precise than in the previous approach, but it remains consumptive of computational time and calibration time, as well as memory for the computations. In addition, this model requires dynamic speeds as input data which remains limited to a road network for which dynamic speed values are measured.

Chinese patent applications CN109191793 A, CN102496079 A, IN202041007032 A, CN105206056 A, CN110232816 A describe an emissions monitoring system. For this system, several sensors are necessary for real-time measurement of the road traffic and of the pollutant emission for each vehicle type. Implementation of this system remains limited due to its computational cost.

SUMMARY OF THE INVENTION

The present invention determines an amount of pollutant emissions from at least one vehicle over a section of a road network by taking into account the impact of congestion, traffic signs and the topography of the road network (slope, road maintenance, etc.). The invention therefore relates to a method of determining the amount of pollutant emissions from at least one vehicle over a road network section. The pollutant emission model is constructed by machine learning using macroscopic data of a learning road network and traffic data, which is applied to a road network section. Dependence of the model on the macroscopic data of the road network and on the traffic data allow having a precise model at the scale of a road network (fine spatial scale) representative of the congestion, traffic signs and topography of the road network. Furthermore, application of this model requires a reduced computational time and a reduced computational memory in relation to the "microscopic" methods of the prior art, which facilitates the implementation thereof. The method requires no specific instrumentation for each vehicle, which also facilitates the implementation thereof.

The invention also relates to a method for determining the amount of at least one pollutant emission from at least one vehicle over a section of a road network. The following steps are carried out for this method:

a) constructing a training set from at least macroscopic data of a learning road network and from at least one of measured and simulated data relative to the traffic on the learning road network, b) constructing a pollutant emission model using a machine learning method trained on the constructed training set, the pollutant emission model associating with at least one road network section an amount of at least one pollutant emission according to the macroscopic data of the at least one section of the road network being considered and to at least one of measured and simulated data relative to the traffic of the road network considered; and c) determining an amount of at least one pollutant emission from the at least one vehicle on the road network being considered by applying the pollutant emission model to macroscopic data of the at least one section of the road network being considered and to measured and simulated data relative to the traffic of the road network being considered.

According to one embodiment, the traffic data is measured by at least one of at least one sensor located on at least one section of the road network and the traffic data is simulated by traffic simulation, the traffic data being preferably at least one of the traffic flow and the average speed of the at least one vehicle for a predetermined period of time.

According to one implementation, the training set is constructed by additionally using data of a vehicle fleet associated with the learning road network.

According to one aspect, an amount of at least one pollutant emission from the at least one vehicle on the at least one section of the road network being considered is further determined using data of a vehicle fleet associated with the road network being considered.

According to an embodiment, the training set is constructed by carrying out the following steps:
  i) determining at least one instantaneous vehicle speed profile by measuring the position, speed and altitude of at least one vehicle on at least one of the learning road network and by generating at least one instantaneous speed profile of at least one vehicle;
  ii) categorizing each section of the learning road network according to the macroscopic data of the learning road network; and
  iii) constructing a microscopic pollutant emission model at a scale of a vehicle connecting an instantaneous speed profile of the at least one vehicle and the category of the at least one section of the learning road network to an average amount of at least one pollutant and a standard deviation.

Advantageously, the pollutant emission model is constructed by machine learning using the microscopic pollutant emission model, the category of the sections of the learning road network, the at least one speed profile and the measured data of the traffic.

Advantageously, at least one speed profile of at least one vehicle is generated by the use of the macroscopic data of the learning road network and at least one of the measured and simulated traffic data using a vehicle speed model constructed by use of a machine learning method from at least one of the measured and/or simulated traffic data and the macroscopic data of the learning road network.

According to an aspect, an amount of pollutant emissions is determined over the at least one section of the road network being considered by carrying out the following steps:
  i) categorizing the at least one section of the road network being considered;
  ii) at least one of measuring and simulating the traffic on at least one section of the road network being considered by at least one of a counting loop and a traffic simulation respectively; and
  iii) determining an amount of at least one pollutant emission from the at least one vehicle over the at least one section of the road network being considered by use of the pollutant emission model according to the category of the section of the road network and the traffic measurement.

According to an embodiment option, the category of the at least one section is selected from among: a roundabout, a highway, a traffic light, a speed bump, an underpass, a section with no intersection, a priority intersection, and an urban highway.

According to an implementation, the machine learning is a supervised machine learning method, preferably the machine learning is selected from among a multiple linear regression, a neural network, a random forest or a combination of these methods.

According to an embodiment, the machine learning comprises a cross-validation method, notably a k-fold cross-validation method.

According to a feature, the macroscopic data of the road network is at least one of the topology, traffic signs and the speed limit. Preferably the macroscopic data of the road network is provided by a geographic information system.

According to an embodiment, the amount of at least one pollutant emission from the at least one vehicle on the at least one section of the road network is displayed on a road map, preferably by use of a smartphone or a computer system.

BRIEF DESCRIPTION OF THE DRAWINGS

Other features and advantages of the method according to the invention will be clear from reading the description hereafter of embodiments given by way of non-limitative example, with reference to the accompanying figures wherein.

DETAILED DESCRIPTION OF THE INVENTION

The present invention relates to a method of determining the amount of at least one pollutant emission from at least one vehicle over at least a section of a road network. Thus, in general terms, the method allows determination of the amount of pollutant emissions from a vehicle or vehicles on a portion of a road network. The amount of pollutant emissions can for example be expressed in mass per distance, or in concentration or volume per distance. The road network is made up of all the roads for a given territory, a country or a region for example, or a city, etc. A road network section is an elementary subdivision of the road network between two consecutive nodes of the road network. For example, a road network section can be a road between two consecutive intersections, between two consecutive traffic signs, between an intersection and a traffic sign, or a part of a highway between two consecutive exits, etc. A fine division of the road network is thus available, as well as a model that is suited to the road network without microscopic data. Thus, this division provides a pollutant emission determination which is as representative as possible at a fine spatial scale.

The method according to the invention allows determination of emissions of at least one pollutant (including gaseous compounds and/or particles) from among nitrogen oxides NOx, carbon dioxide CO2, carbon monoxide CO, fine particles PM, and unburnt hydrocarbons, etc.

Preferably, the vehicle is a motorized vehicle travelling within a road network, such as an automotive vehicle, a two-wheeler, a heavy goods vehicle, a coach, a bus.

Advantageously, the method according to one embodiment of the invention can determine the amount of pollutants for vehicles travelling on the road network. Thus, the invention allows measuring the amount of pollutant emissions for a set of vehicles, thus providing determination of the amount of pollutant emissions for at least one section of the road network, and preferably for a plurality of road network sections.

According to the invention, the following steps are carried out:
1. Constructing a training set
2. Constructing the pollutant emission model
3. Determining the amount of pollutants.

These steps can be carried out by a computer. Steps 1 and 2 can be carried out offline and step 3 can be carried out online. Online use of the model constructed offline allows reduction of online computational time and a limited need for computer memory in relation to a microscopic model, while involves good precision. These steps are detailed in the rest of the description.

The invention can be seen as a method using a sensor (traffic measurement) and signal processor (pollutant emission model) to determine a physical quantity of the amount of pollutant emissions.

Figure 1:
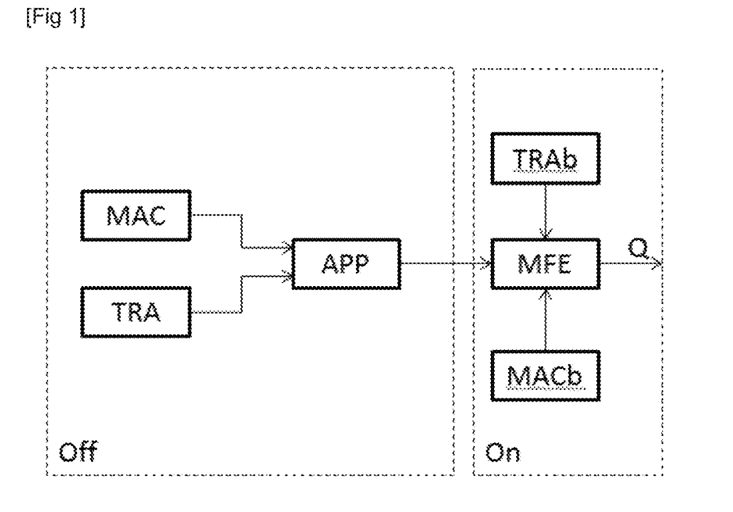
FIG. 1 illustrates the method of determining the amount of pollutant emissions according to a first embodiment of the invention.

FIG. 1 schematically illustrates, by way of non-limitative example, the steps of the method of determining pollutant emissions according to an embodiment of the invention. By using macroscopic data (MAC) of a learning road network and traffic data (TRA) of the learning road network making up a training set, a learning method (APP) is trained and the pollutant emission model (MFE) is determined. These first steps are carried out offline (Off). Then, online (Onl), a pollutant emission model (MFE) provides determination of an amount of pollutants (Q) for the road network section being considered, whose traffic data (TRAb) and macroscopic data (MACb) is known.

1. Constructing the Training Set

This step constructs a training set for a learning road network. The learning road network is a road network for which some characteristics used in Step 2 for constructing the pollutant emission model are known. The learning road network can be different from or identical to the road network used in Step 3. Indeed, the invention allows determination of the amounts of pollutant emissions for another road network than the one used to construct the model.

The training set is constructed from at least macroscopic data of a learning road network and from at least one of measured and simulated data relative to the traffic on the learning road network. The macroscopic road network data corresponds to information related to the road network, such as infrastructure, slope, traffic signs, etc. The traffic data is the measured or simulated data representing the traffic on the road network.

According to one aspect of the invention, the macroscopic road network data can be the topology (i.e. the slope, the bends, the intersections, the traffic signs, etc.). Preferably, the macroscopic road network data can be provided by a geographic information system (GIS). Examples of such geographic information systems are Here Maps™, Google Maps™, OpenStreetMap™. The macroscopic data is always available from any place. Thus, it can serve as single input data for the training set and the pollutant emission model.

Preferably, the traffic data can be selected from the flow of vehicles on at least one of the road network and the average speed of the vehicles for a predetermined period of time (for example for a time slot, a day, a week, a month, etc.).

According to one implementation of the invention, the traffic data can be measured by a sensor located on at least one section of the road network, such as a counting loop, a camera, a radar, sensitive photo-electric cells detecting light beam break, piezo-electric cables measuring the pressure exerted on the roadway, or any similar sensors. These sensors are point sensors, therefor the measurements are specific and they are not performed for all the road network sections. Furthermore, traffic data simulated with a traffic simulator can also be used. The simulator, known as SUMO (Simulation of Urban MObility), is an example of an open-source traffic simulator. Other traffic simulators may be used. The simulated data can complete the measured data if it is not sufficient, and thus improve the construction of the pollutant emission factor model.

According to an embodiment option, construction of the training set (and therefore construction of the pollutant emission model) can further account for the vehicle fleet used for the road network being considered. The vehicle fleet can be the current fleet of vehicles travelling on the road network being considered, which is here the learning road network. It can be defined by the user according to at least one of history records and to prior knowledge of the vehicle fleet in the zone considered which is the road network. Thus, the predefined fleet is a distribution in number or in percentage of vehicles in each predetermined vehicle travelling on the road network section. Within the vehicle fleet, the vehicles are categorized, the vehicle category can notably include a European emission standard, a cylinder capacity, an engine type (gasoline, diesel, electric, etc.), and an aftertreatment technology. This vehicle fleet distribution can be performed for passenger cars, trucks, light-duty vehicles, two-wheelers, etc. By taking the vehicle fleet into account, determination of the pollutant emissions is more representative of real conditions.

According to one embodiment of the invention, the training set can be constructed by carrying out the following steps:
 1.1 Determining an instantaneous speed profile
 1.2 Categorizing the road network sections
 1.3 Constructing a microscopic pollutant emission model.

These steps can be carried out by a computer. They are detailed in the rest of the description. Steps 1.1 and 1.2 can be carried out in this order, in reverse order or simultaneously.

For this embodiment, the training data of the machine learning method can comprise the category of the road network sections, the traffic data, the speed profile and the emissions determined from the microscopic pollutant emission model, and, if appropriate, the vehicle category (embodiment wherein the vehicle fleet of the road network is taken into account).

Figure 2:
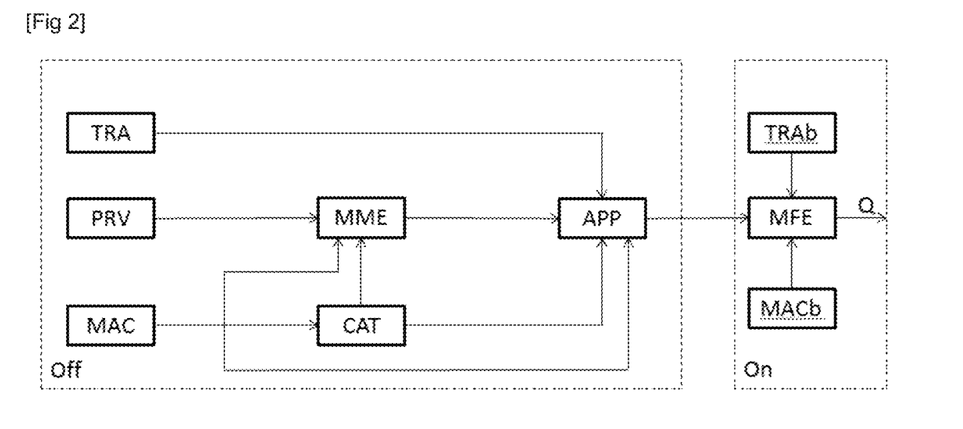
FIG. 2 illustrates the method of determining the amount of pollutant emissions according to a second embodiment of the invention.

FIG. 2 schematically illustrates, by way of non-limitative example, the method of determining pollutant emissions according to one embodiment of the invention. An instantaneous speed profile (PRV) is determined for this embodiment. Furthermore, the macroscopic data (MAC) of the learning road network is used to categorize (CAT) the road network sections. This instantaneous speed profile (PRV) and these road network section categories (CAT) allow constructing and application to a microscopic pollutant emission model (MME). By using macroscopic data (MAC) of the learning road network, the road network section categories (CAT), the instantaneous speed profile (PRV), the microscopic pollutant emission model (MME) and traffic data (TRA) that make up a training set. The pollutant emission model (MFE) is determined by a machine learning method (APP). These first steps are carried out offline (Off). Then, online (Onl), the pollutant emission model (MFE) enables determination of the amount (Q) of pollutants for the road network section being considered, whose traffic data (TRAb) and macroscopic data (MACb) are known.

1.1 Determining an Instantaneous Speed Profile

This substep determines at least one instantaneous vehicle speed profile by measuring the speed, the position and the altitude of at least one vehicle on at least one of the learning road network and by generating at least one speed profile of at least one vehicle on the learning road network. The speed profile is understood to be the variation of the instantaneous speed of the vehicle along a road network section. Taking account of a speed profile provides a greater model precision, notably in relation to a model taking only into account the average speed over the road network section being considered. Indeed, the dynamic aspect of the speed profile notably allows the acceleration and deceleration of the at least one vehicle to be taken into account.

Preferably, at least one instantaneous speed profile can be determined by measurement and at least one instantaneous speed profile is generated in cases where the number of measurements are limited. Thus, the speed profiles which are determined include at least one measured speed profile.

Advantageously, the instantaneous speed profile can be a high sampling frequency (minimum 1 Hz) speed profile. This high sampling frequency provides better precision of the speed profile and, a fortiori, better precision of the pollutant emission model.

According to one embodiment of the invention, the speed, the position and the altitude of at least one vehicle can be measured using a smartphone or a geolocation system (GPS for example), or an instrumentation of at least one vehicle, or any similar device. Measurement by a smartphone provides large-scale measurement without requiring instrumentation of many vehicles.

According to one implementation of the invention, this step can use an FCD (Floating Car Data) database. By way of non-limitative example, the FCD database used can contain about two million speed profiles for about two hundred thousand road network sections.

According to an embodiment, at least one instantaneous speed profile can be generated by a microscopic traffic simulator. The simulator known as SUMO (Simulation of Urban MObility) is an example of an open-source microscopic traffic simulator.

Alternatively or cumulatively, at least one instantaneous speed profile of at least one vehicle on the learning road network can be generated by the macroscopic data of the learning road network and of the measured traffic data, using a vehicle speed model constructed with a machine learning method from the measured traffic data and the macroscopic data of the learning road network.

For this embodiment, steps A and B below can be carried out, as detailed in patent application FR-3,096,822 (WO-2020/239,503):

A. Constructing the Vehicle Speed Model

This step constructs a vehicle speed model by a machine learning method trained from a training set comprising at least macroscopic data of the learning road network and data relative to routes travelled on the learning road network. The travelled route data allow accounting for real behaviors to generate a representative and precise vehicle speed model. The vehicle speed model associates with at least one road network subdivision (preferably with a road network section) at least one vehicle speed profile according to macroscopic road network data and travelled route data.

According to one aspect of the invention, the travelled route data can comprise data measured during prior trips, notably the speed, position and altitude. Preferably, the travelled route data can be measured by a geolocation sensor such as a satellite-based positioning sensor, for example the GPS system (Global Positioning System), the Galileo system, etc. The geolocation system can be an in-vehicle or a remote sensor (using a smartphone for example).

According to one embodiment of the invention, the vehicle speed model can be constructed by carrying out details from reference made to patent application FR-3,096,822 (WO-2020/239,503) of:
A.1 Segmenting the road network, into connection triplets for example, with each connection triplet comprising a road network section formed between two nodes of the road network, its origin and its destination;
A.2 Categorizing road network segments (this categorization can be identical to or different from the categorization of step 1.2 described hereafter);
A.3 Classifying travelled route data for each road network segment category;
A.4 Generating at least one speed profile, for example by a linear or parabola functions, or of a combination of such functions with this generation being achieved by machine learning, which for example may be a neural network method, a support vector machine method, a random forest method or other supervised (or possibly unsupervised) learning methods, advantageously by use of two cascade neural networks.

B. Predicting at Least One Speed Profile

This step predicts at least one vehicle speed profile on the portion of the learning road network being considered. It may be a portion of the learning road network that has been travelled during prior trips, a portion of the learning road network that has been partly travelled during prior trips, or a portion of the learning road network that has not been travelled during prior trips (it may even be a non-existing road network portion for which a speed profile is to be predicted). For this step, the vehicle speed model which is constructed in step A is applied to the macroscopic data of the road network portion being considered. Thus, the topological data of the road network portion being considered is taken into account. Practically, at least one speed profile is assigned to each subdivision (preferably to each connection) of the road network portion considered.

According to one embodiment of the invention, the vehicle speed model can be applied by carrying out the following steps; for more details on these steps, reference can be made to patent application FR-3,096,822 (WO-2020/239,503) as follows:

B.1 Segmenting the road network section, preferably in the same way as in step A.1;

B.2 Categorizing the road network section, preferably in the same way as in step A.2; and B.3 Assigning at least one speed profile to each road network section being considered using a speed profile generated by the vehicle speed model, according to the categorization of the road network section (in other words, the segment of the road network portion considered has a speed profile identical to the speed profile of the segment having the same category in the vehicle speed model).

These steps can be carried out by a computer.

1.2 Categorizing the Road Network Sections

This step categorizes each section of the learning road network by use of the macroscopic data of the learning road network. In other words, a category including the road network sections having the same features is associated with a road section. Thus, in order to reduce the computational times and for wider and simplified use thereof, it is proposed in the invention to recalibrate the pollutant amounts according to a fine decomposition of the network (by infrastructure type, i.e. by road network section category).

According to one embodiment, the categories can be formed from the following criteria: presence or absence of traffic signs (a traffic light for example), presence or absence of an intersection, priority road or not, bend sharpness, functional class (characterizing the road network hierarchy and the level of importance of the segment, for example highway, street, etc.), number of lanes, presence or absence of an underpass, presence or absence of a roundabout, etc. These criteria are obtained directly from the macroscopic road network data.

Advantageously, by way of non-limitative example, in order to limit the number of categories and to maintain good road network representativity, the road network section categories can be:
section with roundabout,
highway section,
section with traffic light,
section with speed bump,
section with underpass (reduction in the number of lanes),
section without intersection,
section with priority intersection,
urban highway section.

In other words, for this embodiment, one of these eight categories can be assigned to each section of the learning road network.

1.3 Constructing a Microscopic Pollutant Emission Model

This step constructs a microscopic pollutant emission model, at the scale of a vehicle, connecting the instantaneous speed profile of the vehicle and the road network category to an average amount and to a standard deviation of the amount of pollutant emissions from the vehicle on the road network section. In other words, the microscopic model allows determination of the pollutant emissions from a vehicle on a road network section which depends on the vehicle type.

Such a model is referred to as microscopic because its computation of the instantaneous (every second for example) amounts of pollutant emissions from a vehicle. According to a non-limitative example, the microscopic model used in the present invention can be inspired from the model described in patent application FR-3,049,653 (WO-2017/174,239). It can be a physical model of the longitudinal dynamics of the vehicle, the powertrain and the electrical chain, or the pollution control systems. The output of this model, within the context of the present invention, is statistically aggregated so as to extract therefrom an average pollutant amount and a standard deviation, for each pollutant. In a variant, the CMEM (Comprehensive Modal Emission Model) is another example of a microscopic emission model.

As input data, for each category of learning road network section, the microscopic pollutant emission model uses the dynamic speed trajectories (the instantaneous speed profiles) and the evolution of the slope over the road section which is considered that belongs to the category. At the output of this step, an average pollutant amount and the corresponding standard deviation are defined for each emission type (each pollutant type considered), infrastructure category, vehicle category (for the embodiment wherein the vehicle fleet is taken into account), flow and average speed belonging to the training data. Besides the vehicle type, the slope, the flow and the average speed have a first-order impact on the emissions. The standard deviation allows accounts for some driving behaviors that may vary within a single road section or within road sections having the same characteristics.

Preferably, the method can comprise a step of calibration and validation of the microscopic model with several measurements under real driving conditions. It therefore provides a reliable emission estimation taking account of the impacts of the infrastructure.

According to one embodiment, the microscopic model can be applied to dynamic speed profiles which preferably are a plurality of speed profiles for each characteristic selected from among the average speed, the slope and the vehicle flow.

2. Constructing the Pollutant Emission Model

This step constructs a pollutant emission model using a machine learning method trained by the learning base constructed as described above, comprising at least macroscopic data of the learning road network and road network traffic data. The pollutant emission model associates with at least one road network section an amount of pollutant emissions from at least one vehicle according to the macroscopic data and the traffic data. Given that the traffic data varies over time (considering for example the congestion hours at the beginning and at the end of the day, or the day of the week, or the month, etc.), the constructed pollutant emission model determines a pollutant amount depending on the time being considered, making determination of the pollutant amounts precise at the time scale considered.

In this step, a pollutant emission model can be constructed by machine learning, preferably by supervised machine learning, by applying the microscopic model of step 1.3, for the category of road network sections, traffic data, speed profile and possibly the vehicle style (among the vehicle fleet). Given that the proposed invention considers the traffic flow and the infrastructure category, this allows the emission precision to be improved, even under very heavy congestion conditions. Furthermore, the invention provides a pollutant emission model that is simple to use and requires much less measurements for calibration and exploitation.

The purpose of this step is to construct the pollutant emission model. Such a model allows pollutant amounts to be computed for other sections or other road networks outside the learning base. This model identifies for each emission type, and possibly each vehicle category, the connection and the correlation between the emission factor, the infrastructure category, the flow and the average speed. This identification can thus be written in the form:

$$\overline{EF}, STD = f(Cat, slope, V_m, flow, EMS, veh)$$

with $\overline{EF}$,STD being the average emission factor and the corresponding standard deviation, Cat is the category of the road network section (obtained in step 1.2), slope is the slope of the road network section (obtained from the macroscopic data), Vm is the average speed (obtained with the speed profile), flow is the vehicle flow on the road network section (obtained from the traffic data), EMS is the type of pollutant emissions considered that is the nature of the pollutant released, for example $CO_2$, $NO_x$, CO, etc.), and veh is the vehicle category (obtained with the vehicle fleet).

Function f can be based on a supervised learning algorithm such as a multiple linear regression, a neural network, a random forest or a combination of these methods. By way of non-limitative example, the method can use a neural network with two hidden layers of twenty and fifteen neurons respectively; a random forest with twenty estimators (or trees) of depth equal to 15 or any equivalent algorithm can also be used.

According to one aspect, this step can include a validation method, preferably a cross-validation method, notably a k-fold cross-validation method. This cross-validation method allows "overfitting" problems to be reduced and the model precision to be improved.

The constructed pollutant emission model provides, by use of the average and the standard deviation, precise determination of the pollutant emissions, which is capable of reproducing the same statistical variability of the observable pollutant emissions as the microscopic model, for all the road network sections and, if appropriate, for all the vehicle categories.

3. Determining the Amount of Pollutants

This step determines an amount of pollutant emissions from the at least one vehicle (preferably multiple vehicles) on the at least one road network section being considered, by applying the pollutant emission model determined in step 2 to macroscopic data of the road network section being considered and to measured traffic data. The road network being considered can be identical to or different from the learning road network. In other words, for the road network section being considered, the macroscopic data and the traffic data is known, and the model constructed in the previous step is applied to this data relative to the road network section being considered, which allows determination of an amount of pollutant emissions from the vehicle for this road network section.

According to an embodiment option, application of the pollutant emission model can also account for the vehicle fleet used for the road network being considered. The vehicle fleet considered in this step can be different from the vehicle fleet being considered for construction of the pollutant emission model. Indeed, the vehicle fleet used for the training data can be different from the vehicle fleet of the road network being considered, for example the vehicle fleet can be different from one region to another, or it can vary over time, etc. The vehicle fleet can be the current fleet of vehicles travelling on the road network being considered. It can be defined by the user according to at least one history records and to prior knowledge of the vehicle fleet in the zone being considered. Thus, the predefined fleet is a distribution in number or in percentage of vehicles of each predetermined vehicle travelling on the road network section. Within the vehicle fleet, the vehicles are categorized, the vehicle category can include a European emission standard, a cylinder capacity, an engine type (gasoline, diesel, electric, etc.), and an aftertreatment technology. This vehicle fleet distribution can be performed for passenger cars, trucks, light-duty vehicles, two-wheelers, etc. By taking the vehicle fleet into account, determination of the pollutant emissions is more representative of real conditions.

According to one embodiment of the invention, determination of the amount of pollutants can comprise carrying out the following steps:
2.1 Categorizing the road network section
2.2 Traffic measurement on the road network section
2.3 Determining the amount of pollutants.

These steps can be carried out by a computer. They are detailed in the rest of the description. Steps 2.1 and 2.2 can be carried out in this order, in reverse order or simultaneously.

Figure 3:
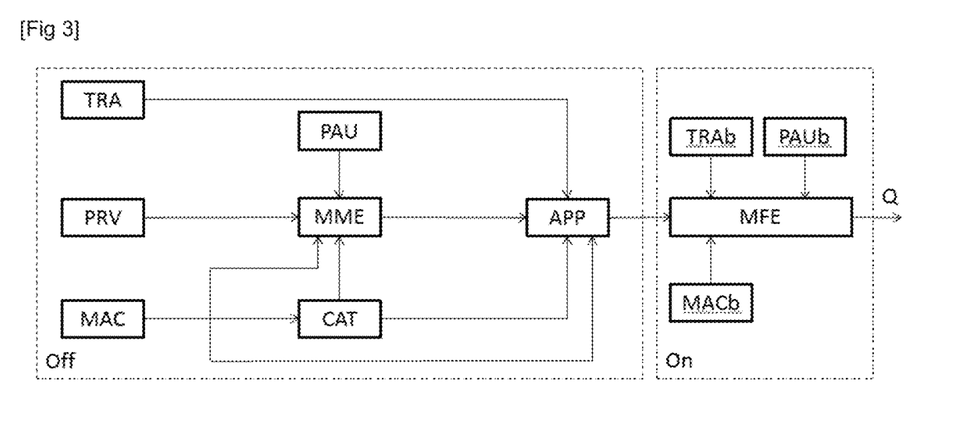
FIG. 3 illustrates the method of determining the amount of pollutant emissions according to a third embodiment of the invention.

FIG. 3 schematically illustrates, by way of non-limitative example, the method of determining the amount of pollutant emissions according to one embodiment of the invention. An instantaneous speed profile (PRV) is determined for this embodiment. Furthermore, the macroscopic data (MAC) of the learning road network is used to categorize (CAT) the road network sections. This instantaneous speed profile (PRV) and these road network section categories (CAT), as well as a vehicle fleet (PAU), allow construction and apply a microscopic pollutant emission model (MME). By using macroscopic data (MAC) of the learning road network, the road network section categories (CAT), the instantaneous speed profile (PRV), the microscopic pollutant emission model (MME) and traffic data (TRA), a learning base is constructed and the pollutant emission model (MFE) is determined a machine learning method (APP). These first steps are carried out offline (Off). Then, online (Onl), the pollutant emission model (MFE) enables determination of the amount (Q) of pollutants for the road network section being considered, whose traffic data (TRAb) and macroscopic data (MACb), as well as vehicle fleet (PAUb), are known.

2.1 Categorizing the Road Network Section

This step categorizes the at least one section of the road network being considered. Preferably, all the sections of the road network being considered can be categorized in the same manner as in step 1.2. Thus, the road network sections can be preferably categorized in the following eight categories:
section with roundabout,
highway section,
section with traffic light,
section with speed bump,
section with underpass (reduction in the number of lanes),
section without intersection,
section with priority intersection,
urban highway section.

2.2 Traffic Data Measurement on the Road Network Section

This step at least one of measures and simulates the traffic on the at least one section of the road network considered by use of at least one sensor located on at least one section of the road network, such as a counting loop, a camera, a radar, sensitive photo-electric cells detecting light beam break, piezo-electric cables measuring the pressure exerted on the roadway, or any similar sensors. These sensors are point sensors, the measurements therefore are specific, they are not performed for all the road network sections. Furthermore, traffic data simulated with a traffic simulator can also be used. The simulator known as SUMO (Simulation of Urban MObility) is an example of an open-source traffic simulator. Other traffic simulators may be used. This simulated data can complete the measured data if it is not sufficient, and thus improve the construction of the pollutant emission model.

2.3 Determining the Amount of Pollutants

This step determines an amount of pollutants for each road network section being considered by the pollutant emission model, according to the categorization of the road network segment, at least one of the measured and simulated traffic data, and possibly the vehicle fleet. In other words, the road network section being considered has an amount of pollutant emissions corresponding to the traffic, the topology of the road network section and possibly the vehicle fleet.

The method can further comprise an optional step of displaying the pollutant amount determined for at least one section of the road network being considered. In this optional step, the amount of pollutant emissions can be displayed on a road map. This display can use a rating or a colour code. Optionally, a rating or a colour can be associated with each section of the road network. It can be displayed on board a vehicle on the dashboard, on an autonomous mobile device such as a geolocation device (of GPS type), a mobile phone (of smartphone type), or any similar system. It is also possible to display the amount of pollutant emissions on a website. Furthermore, the amount of pollutant emissions can be shared with the public authorities (road maintenance management for example) and public works companies. Thus, the public authorities and the public works companies can optimize the road infrastructure in order to improve the emissions levels.

Example

The features and advantages of the method according to the invention will be clear from reading the application example hereafter.

Figure 4:
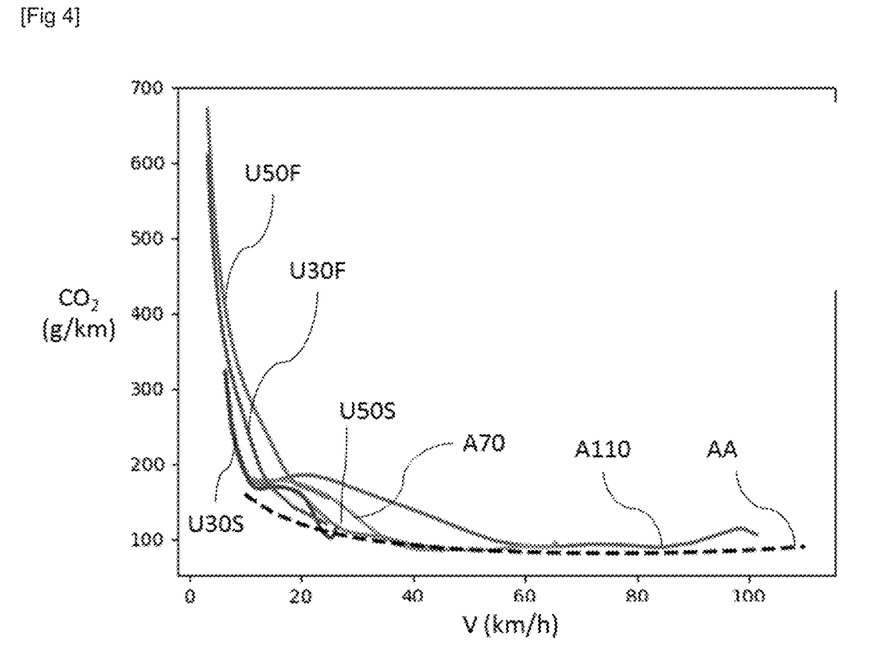
FIG. 4 is a curve showing the amount of pollutant emissions as a function of the average speed for an example involving eight scenarios.
Figure 5:
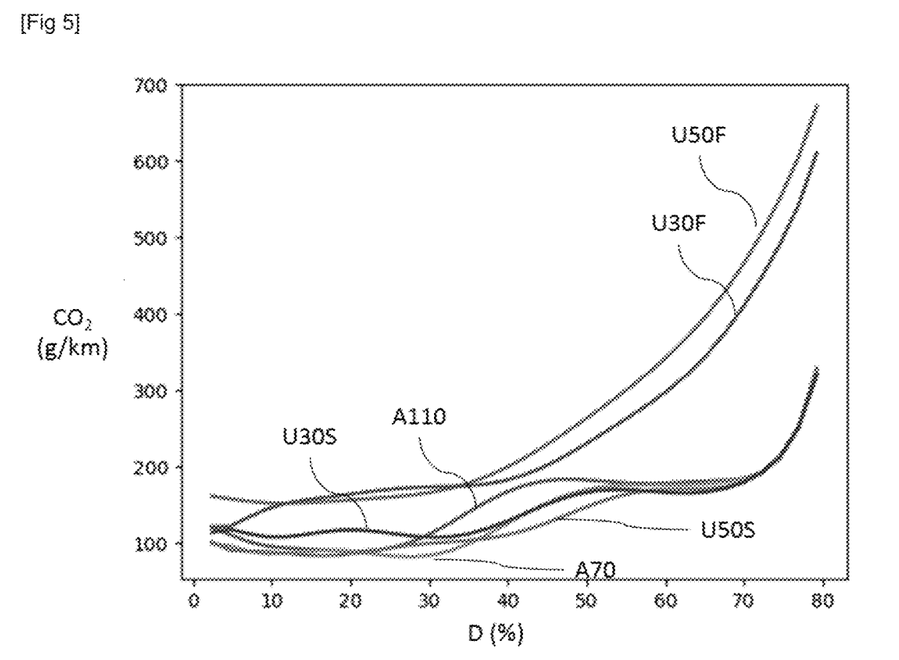
FIG. 5 is a curve showing the amount of pollutant emissions as a function of the traffic density for the example of FIG. 4.

In order to illustrate the invention, a series of experiments has been carried out with the microscopic traffic simulator SUMO. Using a microscopic traffic simulator allows control by the generation of 1 Hz speed profiles under various congestion conditions, but this is not strictly necessary for creating the model (step 1 of the method according to the invention). For this simulation, the dynamics of the vehicles are controlled by the car-following model IDM (Intelligent Driver Model). The simulations are performed on a 300 m-long circular road comprising a traffic light whose cycle length is 90 seconds. The following scenarios are defined:

highway 110 km/h: speed limit set at 110 km/h, without traffic light, in FIGS. 4 and 5 this scenario bears reference A110, highway 70 km/h: speed limit set at 70 km/h, without traffic light, in FIGS. 4 and 5 this scenario bears reference A70, urban road 50 km/h (no traffic light): speed limit set at 50 km/h, without traffic light, in FIGS. 4 and 5 this scenario bears reference U50S, urban road 30 km/h (no traffic light): speed limit set at 30 km/h, without traffic light, in FIGS. 4 and 5 this scenario bears reference U30S, urban road 50 km/h (with traffic light): speed limit set at 50 km/h, with traffic light, in FIGS. 4 and 5 this scenario bears reference U50F, urban road 30 km/h (with traffic light): speed limit set at 30 km/h, with traffic light, in FIGS. 4 and 5 this scenario bears reference U30F.

For each scenario, various simulations are carried out with a vehicle density on the ring ranging from 0% to 80% of the maximum density of the structure. Each simulation lasts 1 hour. After each experiment, the $CO_2$ emissions of the vehicles are computed from their speed profiles, using a physical microscopic energy consumption model (step 1.3 of the invention). For this example, Euro 4 diesel type light vehicles are simulated.

The trajectories of the vehicles also provide information on the average traffic speed and on the distance travelled by the vehicles. By considering the emissions in relation to the distance travelled, each experiment can be associated with a $CO_2$ emission rate for example, expressed in g/km.

FIG. 4 shows, for each scenario, the $CO_2$ emission rate in g/km as a function of the average traffic speed V in km/h. By way of non-limitative example, the emission rates have been approximated by polynomial regressions in this example. They are compared with the emissions computed with the macroscopic emission factor type method COPERT (state of the art denoted by AA), which uses only the average traffic speed as the input. It can be noted that this approach of the prior art considers at the input a minimum value of 10 km/h, which leads to a bad emission characterization under heavy congestion conditions and therefore at a very low average speed. On the contrary, the invention provides characterization of the pollutant emissions even in case of heavy congestion and at low average speed. In the scenarios considered, it is observed that the "emission factor" approach of the prior art generally gives a good approximation of the pollutant emissions for high average speeds. However, this approach of the prior art is likely to greatly underestimate the pollutant emissions at lower average speeds, because it does not take account the infrastructure type and the congestion impact. Thus, the urban scenarios with traffic lights have for example emission levels computed according to the invention that are much greater than those given by the prior art method based on emission factors.

The results of this series of experiments can be illustrated with another perspective in order to notably be able to associate a density with an average speed value. Thus, FIG. 5 shows the evolution of the $CO_2$ emission rate in g/km as a function of the vehicle density D in % for these scenarios. For this example, it is noted that it is under heavy congestion conditions that the emissions may differ most from the output of the model based on the emission factors of the prior art. On the contrary, the invention allows to better consider these situations by taking account of the road traffic.

The invention claimed is:

1. A method for determining an amount of pollutants emitted from for at least one vehicle travelling over at least one section of a road network, comprising steps of:
   a) constructing a training set from at least macroscopic data from a learning road network and from at least one of measured data from traffic on the road network and simulated data relative to vehicle traffic occurring on the learning road network;
   b) constructing a model of pollutant emissions using a machine learning method trained by using the constructed training set, the model of pollutant emissions associating with the at least one road network section according to the macroscopic data of the at least one section of the road network and to at least one of the measured data and the simulated data relative to traffic travelling on the road network;
   c) measuring the traffic data by using at least one sensor located on the at least one road network section and the traffic data is simulated by traffic simulation with the traffic data being at least one of an average speed of at least one vehicle travelling on the at least one road network section; and
   d) determining the amount of at least one pollutant emitted from at least one vehicle travelling on at least one of the section of the road network by applying the pollutant emission model to macroscopic data of the at least one section of the road network and to at least one of the measured traffic data and simulated traffic data relative to the traffic on the at least one road section.

2. A method as claimed in claim 1, wherein the training set is constructed by additionally using data of a vehicle fleet associated with the learning road network.

3. A method as claimed in claim 1, wherein an amount of at least one pollutant emission from the at least one vehicle on the at least one section of the road network is further determined using data of a vehicle fleet associated with the road network.

4. A method as claimed in claim 2, wherein an amount of at least one pollutant emission from the at least one vehicle on the at least one section of the road network is further determined using data of a vehicle fleet associated with the road network.

5. A method as claimed in claim 1, wherein the training set is constructed by carrying out steps of:
   i. determining at least one instantaneous vehicle speed profile by measuring the position, speed and altitude of at least one vehicle on at least one of the learning road network and by generating at least one instantaneous speed profile of at least one vehicle;
   ii. categorizing each section of the learning road network according to the macroscopic data of the learning road network; and
   iii. constructing a microscopic pollutant emission model at a scale of vehicles travelling on the at least one section of the road network connecting an instantaneous speed profile of the at least one vehicle and the category of the at least one section of the learning road network to an average amount of at least one pollutant and a standard deviation.

6. A method as claimed in claim 3, wherein the training set is constructed by carrying out steps of:
   i. determining at least one instantaneous vehicle speed profile by measuring the position, speed and altitude of at least one vehicle on at least one of the learning road network and by generating at least one instantaneous speed profile of at least one vehicle;
   ii. categorizing each section of the learning road network according to the macroscopic data of the learning road network; and
   iii. constructing a microscopic pollutant emission model at a scale of vehicles travelling on the at least one section of the road network connecting an instantaneous speed profile of the at least one vehicle and the category of the at least one section of the learning road network to an average amount of at least one pollutant and a standard deviation.

7. A method as claimed in claim 4, wherein the training set is constructed by carrying out steps of:
   i. determining at least one instantaneous vehicle speed profile by measuring the position, speed and altitude of at least one vehicle on at least one of the learning road network and by generating at least one instantaneous speed profile of at least one vehicle;
   ii. categorizing each section of the learning road network according to the macroscopic data of the learning road network; and
   iii. constructing a microscopic pollutant emission model at a scale of vehicles travelling on the at least one section of the road network connecting an instantaneous speed profile of the at least one vehicle and the category of the at least one section of the learning road network to an average amount of at least one pollutant and a standard deviation.

8. A method as claimed in claim 5, wherein the training set is constructed by carrying out steps of:
   i. determining at least one instantaneous vehicle speed profile by measuring the position, speed and altitude of at least one vehicle on at least one of the learning road network and by generating at least one instantaneous speed profile of at least one vehicle;
   ii. categorizing each section of the learning road network according to the macroscopic data of the learning road network; and
   iii. constructing a microscopic pollutant emission model at a scale of vehicles travelling on the at least one section of the road network and connecting an instantaneous speed profile of the at least one vehicle and the category of the at least one section of the learning road network to an average amount of at least one pollutant and a standard deviation.

9. A method as claimed in claim 1, wherein the model of pollutant emissions is constructed by machine learning using a microscopic pollutant emission model, a category of the sections of the learning road network, at least one speed profile and the measured data of the traffic.

10. A method as claimed in claim 1, wherein at least one speed profile of at least one vehicle is generated by use of the macroscopic data of the learning road network and at least one of the measured traffic data and simulated traffic data using a vehicle speed model constructed by use of a machine learning method from at least one of the measured traffic data and the simulated traffic data and the macroscopic data from the learning road network.

11. A method as claimed in claim 2, wherein at least one speed profile of at least one vehicle is generated by use of the macroscopic data of the learning road network and at least one of the measured traffic data and simulated traffic data using a vehicle speed model constructed by use of a machine learning method from at least one of the measured traffic data and simulated traffic data and the macroscopic data from the learning road network.

12. A method as claimed in claim 1, wherein an amount of pollutant emissions is determined over the at least one section of the road network by carrying out the steps of:
  i. categorizing the at least one section of the road network;
  ii. at least one of measuring traffic and simulating the traffic on the at least one section of the road network by using at least one of a counting loop and a traffic simulation respectively; and
  iii. determining an amount of at least one pollutant emission from the at least one vehicle travelling over the at least one section of the road network by use of the pollutant emission model according to a category of the section of the road network and the traffic measurement.

13. A method as claimed in claim 2, wherein an amount of pollutant emissions is determined over the at least one section of the road network being considered by carrying out the steps of:
  i. categorizing the at least one section of the road network being considered;
  ii. at least one of measuring traffic and simulating the traffic on the at least one section of the road network by use of at least one of a counting loop and a traffic simulation respectively; and
  iii. determining an amount of at least one pollutant emission from the at least one vehicle over the at least one section of the road network by use of the pollutant emission model according to a category of the section of the road network and the traffic measurement.

14. A method as claimed in claim 3, wherein an amount of pollutant emissions is determined over the at least one section of the road network being considered by carrying out the steps of:
  iv. categorizing the at least one section of the road network being considered;
  v. at least one of measuring traffic and simulating the traffic on the at least one section of the road network by use of at least one of a counting loop and a traffic simulation respectively; and
  vi. determining an amount of at least one pollutant emission from the at least one vehicle over the at least one section of the road network by use of the pollutant emission model according to a category of the section of the road network and the traffic measurement.

15. A method as claimed in claim 8, wherein the category of the at least one section is selected from a roundabout, a highway, a traffic light, a speed bump, an underpass, a section with no intersection, a priority intersection, and an urban highway.

16. A method as claimed in claim 8, wherein the machine learning is a supervised machine learning method selected from a multiple linear regression, a neural network, a random forest or a combination of these methods.

17. A method as claimed in claim 1, wherein the macroscopic data of the road network is one of topology and traffic signs and the speed limit and the macroscopic data of the road network is provided by a geographic information system.

18. A method as claimed in claim 1, wherein an amount of at least one pollutant emission from the at least one vehicle on the at least one section of the road network is displayed on a road map, by a smartphone or a computer system.

* * * * *